United States Patent
Fitzpatrick et al.

(10) Patent No.: US 9,311,183 B2
(45) Date of Patent: Apr. 12, 2016

(54) ADAPTIVE TARGET CHARGE TO EQUALIZE BIT ERRORS ACROSS PAGE TYPES

(71) Applicant: SanDisk Enterprise IP LLC, Milpitas, CA (US)

(72) Inventors: James Fitzpatrick, Sudbury, MA (US); Li Li, Wellesley, MA (US); Mark Dancho, Chandler, AZ (US); James R. Tylock, Shrewsbury, MS (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 0 days.

(21) Appl. No.: 14/596,174

(22) Filed: Jan. 13, 2015

(65) Prior Publication Data

US 2015/0248326 A1 Sep. 3, 2015

Related U.S. Application Data

(60) Provisional application No. 61/946,730, filed on Mar. 1, 2014.

(51) Int. Cl.

| | |
|---|---|
| *G11C 16/04* | (2006.01) |
| *G06F 11/10* | (2006.01) |
| *G11C 29/52* | (2006.01) |
| *G11C 11/56* | (2006.01) |
| *G11C 29/02* | (2006.01) |
| *G11C 16/12* | (2006.01) |

(52) U.S. Cl.
CPC ........ *G06F 11/1068* (2013.01); *G11C 11/5628* (2013.01); *G11C 16/04* (2013.01); *G11C 29/021* (2013.01); *G11C 29/028* (2013.01); *G11C 29/52* (2013.01); *G11C 16/12* (2013.01)

(58) Field of Classification Search
CPC ...................................................... G11C 16/04

USPC .......................................................... 365/184
See application file for complete search history.

(56) References Cited

U.S. PATENT DOCUMENTS

| | | | | |
|---|---|---|---|---|
| 7,925,936 B1 * | 4/2011 | Sommer | ............ | G11C 11/5628 714/704 |
| 8,345,477 B1 * | 1/2013 | Yang | .................. | G11C 11/5628 365/185.03 |
| 2009/0091990 A1 * | 4/2009 | Park | .................... | G11C 11/5628 365/189.011 |
| 2011/0258495 A1 * | 10/2011 | Tseng | ................ | G11C 16/3418 714/704 |
| 2013/0047044 A1 * | 2/2013 | Weathers | ........... | G11C 16/3459 714/708 |
| 2014/0281820 A1 * | 9/2014 | Alrod | ................. | G11C 16/3459 714/773 |

* cited by examiner

*Primary Examiner* — Hoai V Ho
*Assistant Examiner* — Jay Radke
(74) *Attorney, Agent, or Firm* — Morgan, Lewis & Bockius LLP

(57) ABSTRACT

Systems, methods and/or devices are used to adapt a target charge to equalize bit errors across page types for a storage medium, such as flash memory, in a storage system. In one aspect, the method includes performing a sequence of operations, including: (1) determining a first target charge, a second target charge, and a third target charge, the first, second, and third target charges used for controlling first, second, and third charge distributions, respectively, in cells of the storage medium when data is written to the cells, wherein the second charge distribution is between the first charge distribution and the third charge distribution, (2) determining a first error indicator for lower/fast pages of the storage medium, (3) determining a second error indicator for upper/slow pages of the storage medium, and (4) adjusting the second target charge in accordance with the first error indicator and the second error indicator.

25 Claims, 11 Drawing Sheets

ADAPTIVE TARGET CHARGE TO EQUALIZE BIT ERRORS ACROSS PAGE TYPES

RELATED APPLICATIONS

This application claims priority to U.S. Provisional Patent Application No. 61/946,730, filed Mar. 1, 2014, which is hereby incorporated by reference in its entirety.

TECHNICAL FIELD

The disclosed embodiments relate generally to memory systems, and in particular, to adapting a target charge to equalize bit errors across page types for a storage medium, such as flash memory, in a storage system.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell. For example, a multi-level cell (MLC) NAND flash typically has four possible states per cell, yielding two bits of information per cell. Further, a MLC NAND has two page types: (1) a fast page (sometimes called lower page), and (2) a slow page (sometimes called upper page).

A drawback of increasing storage density is that the stored data is increasingly prone to being stored and/or read erroneously. Further, as a memory device is used, program-erase cycles (PE cycles) wear the memory device and cause it to have less ideal charge distributions, causing bit errors on reads. An error control coding (ECC) engine is utilized to limit the number of uncorrectable errors that are introduced by electrical fluctuations, defects in the storage medium, operating conditions, device history, and/or write-read circuitry, etc. However, relying solely on ECC to manage bit errors may not maximize the life of the memory device.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable adapting a target charge to equalize bit errors across page types for a storage medium, such as flash memory, in a storage system. In one aspect, a target charge (used for controlling charge distributions in cells of the storage medium when data is written to the cells) is adjusted in accordance with a first error indicator for lower/fast pages of the storage medium and a second error indicator for upper/slow pages of the storage medium.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
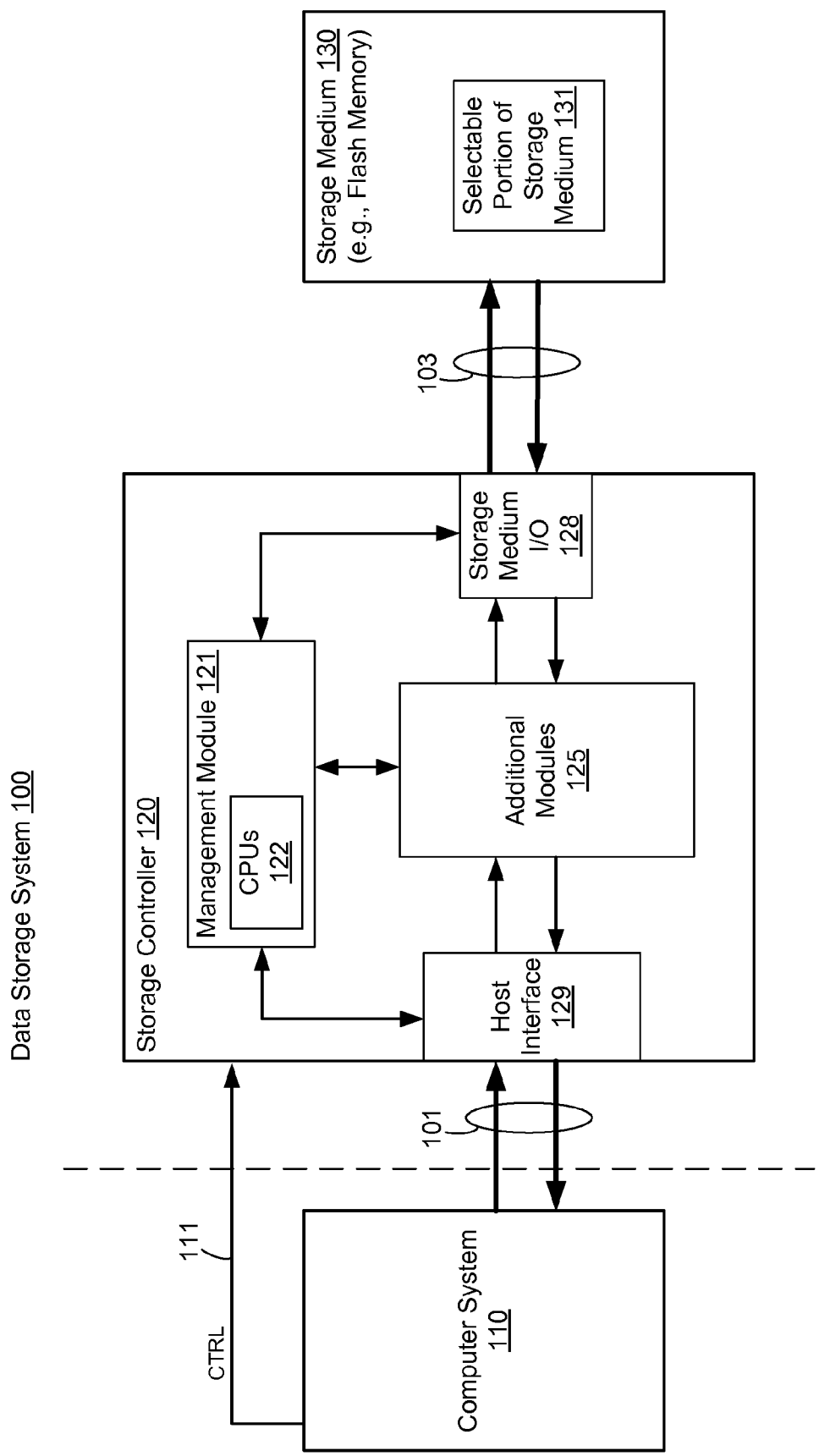
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable adapting a target charge to equalize bit errors across page types for a storage medium in a storage system. Some implementations include systems, methods and/or devices to adjust a target charge in accordance with a first error indicator for lower/fast pages of the storage medium and a second error indicator for upper/slow pages of the storage medium.

More specifically, some embodiments include a method of setting target charges for a storage medium in a storage system. In some embodiments, the method includes performing a sequence of operations, including: (1) determining a first target charge, a second target charge, and a third target charge, the first, second, and third target charges used for controlling first, second, and third charge distributions, respectively, in cells of the storage medium when data is written to the cells, wherein the second charge distribution is between the first charge distribution and the third charge distribution, (2) determining a first error indicator for lower/fast pages of the storage medium, (3) determining a second error indicator for upper/slow pages of the storage medium, and (4) adjusting the second target charge in accordance with the first error indicator and the second error indicator.

In some embodiments, adjusting the second target charge in accordance with the first error indicator and the second error indicator includes: (1) in accordance with a determination that the first error indicator is greater than the second error indicator, increasing the second target charge, and (2) in accordance with a determination that the first error indicator is less than the second error indicator, decreasing the second target charge.

In some embodiments, adjusting the second target charge in accordance with the first error indicator and the second error indicator includes: (1) accumulating a bias value for the second target charge, wherein the bias value increases in accordance with a determination that the first error indicator is greater than the second error indicator and the bias value decreases in accordance with a determination that the first error indicator is less than the second error indicator, (2) in accordance with a determination that the bias value is greater than or equal to a positive threshold: (a) increasing the second target charge, and (b) resetting the bias value, and (3) in accordance with a determination that the bias value is less than a negative threshold: (a) decreasing the second target charge, and (b) resetting the bias value.

In some embodiments, the bias value is accumulated on a per-die basis.

In some embodiments, the method further includes using the first target charge, the adjusted second target charge, and the third target charge to program one or more cells of the storage medium during a write operation.

In some embodiments, determining the first error indicator for lower/fast pages includes measuring the first error indicator on a predetermined number of data units, including, for each data unit of the predetermined number of data units: (1) measuring the first error indicator at a first operating threshold, and (2) measuring the first error indicator at the first operating threshold plus a predetermined increment.

In some embodiments, the method further includes, for each data unit of the predetermined number of data units, using the lower of the first error indicator at the first operating threshold and the first error indicator at the first operating threshold plus a predetermined increment as the determined first error indicator.

In some embodiments, the method further includes, for each data unit of the predetermined number of data units, augmenting the determined first error indicator by a first factor.

In some embodiments, determining the second error indicator for upper/slow pages includes measuring the second error indicator on a predetermined number of data units, including, for each data unit of the predetermined number of data units: (1) measuring the second error indicator at a second operating threshold, and (2) measuring the second error indicator at the second operating threshold plus a predetermined increment.

In some embodiments, the method further includes, for each data unit of the predetermined number of data units, using the lower of the second error indicator at the second operating threshold and the second error indicator at the second operating threshold plus a predetermined increment as the determined second error indicator.

In some embodiments, the method further includes, for each data unit of the predetermined number of data units, augmenting the determined second error indicator by a second factor.

In some embodiments, the sequence of operations is performed for a first die in the storage medium to adjust the second target charge for the first die, and the method further includes performing the sequence of operations for a second die in the storage medium to adjust a distinct second target charge for the second die.

In some embodiments, a first adjustment for the second target charge for the first die, determined in accordance with the sequence of operations performed for the first die, is different than a second adjustment for the second target charge for the second die, determined in accordance with the sequence of operations performed for the second die.

In some embodiments, the second target charge for the first die is adjusted at a different rate than the second target charge for the second die.

In some embodiments, the second target charge for the first die is adjusted in a different direction than the second target charge for the second die.

In some embodiments, the method further includes (1) determining a first read threshold, a second read threshold, and a third read threshold, the first, second, and third read thresholds used for reading first, second, and third values, respectively, in cells of the storage medium when data is read from the cells, (2) adjusting the second read threshold in accordance with the first error indicator and the second error indicator, and (3) adjusting the third read threshold in accordance with the first error indicator and the second error indicator.

In some embodiments, the second read threshold and the third read threshold are adjusted at a faster rate than the second target charge.

In some embodiments, the first target charge, the second target charge, and the third target charge are determined, in part, in accordance with feed-forward characterization values.

In some embodiments, the first error indicator and the second error indicator are a first bit error rate and a second bit error rate.

In some embodiments, the first error indicator and the second error indicator are a first bit error count and a second bit error count.

In some embodiments, the storage medium comprises one or more flash memory devices.

In some embodiments, the storage medium comprises one or more three-dimensional (3D) memory devices.

In another aspect, any of the methods described above are performed by a device operable to set target charges for a storage medium, the device including (1) a storage medium interface for coupling the device to the storage medium, and (2) one or more modules, including a memory management module that includes one or more processors and memory storing one or more programs configured for execution by the one or more processors, the one or more modules coupled to the storage medium interface and configured to perform any of the methods described herein.

In yet another aspect, any of the methods described above are performed by a device including a storage medium interface for coupling the device to the storage medium and means for performing any of the methods described herein.

In yet another aspect, any of the methods described above are performed by a storage system comprising (1) a storage medium (e.g., comprising one or more non-volatile storage devices, such as flash memory devices) (2) one or more processors, and (3) memory storing one or more programs, which when executed by the one or more processors cause the storage system to perform or control performance of any of the methods described herein.

In yet another aspect, some embodiments include a non-transitory computer readable storage medium, storing one or more programs configured for execution by a device coupled to a storage medium, the one or more programs including instructions for causing the device and/or storage medium to perform any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes a storage controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 is NAND-type flash memory or NOR-type flash memory. In some implementations, storage medium 130 includes one or more three-dimensional (3D) memory devices, as further defined herein. Further, in some implementations storage controller 120 is a solid-state drive (SSD) controller. However, other types of storage media may be included in accordance with aspects of a wide variety of implementations.

Computer system 110 is coupled to storage controller 120 through data connections 101. However, in some implementations computer system 110 includes storage controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a trackpad, a digital camera and/or any number of supplemental devices to add functionality.

Storage medium 130 is coupled to storage controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, storage controller 120 and storage medium 130 are included in the same device as components thereof. Furthermore, in some implementations storage controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers. In some embodiments, storage medium 130 includes one or more three-dimensional (3D) memory devices, as further defined herein.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

In some implementations, storage controller 120 includes a management module 121, a host interface 129, a storage medium interface (I/O) 128, and additional module(s) 125. Storage controller 120 may include various additional features that have not been illustrated for the sake of brevity and so as not to obscure more pertinent features of the example implementations disclosed herein, and a different arrangement of features may be possible. Host interface 129 provides an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of storage controller 120. Management module 121 is coupled to host interface 129, additional module(s) 125 and storage medium I/O 128 in order to coordinate the operation of these components.

Additional module(s) 125 are coupled to storage medium I/O 128, host interface 129, and management module 121. As an example, additional module(s) 125 may include an error control module to limit the number of uncorrectable errors inadvertently introduced into data during writes to memory or reads from memory. In some embodiments, additional module(s) 125 are executed in software by the one or more CPUs 122 of management module 121, and, in other embodiments, additional module(s) 125 are implemented in whole or in part using special purpose circuitry (e.g., to perform encoding and decoding functions).

During a write operation, host interface 129 receives data to be stored in storage medium 130 from computer system 110. The data held in host interface 129 is made available to an encoder (e.g., in additional module(s) 125), which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to storage controller 120 requesting data from storage medium 130. Storage controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to a decoder (e.g., in additional module(s) 125). If the decoding is successful, the decoded data is provided to host interface 129, where the decoded data is made available to computer system 110. In some implementations, if the decoding is not successful, storage controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1," and otherwise the raw data value is a "0."

As explained above, a storage medium (e.g., storage medium 130) is divided into a number of addressable and individually selectable blocks and each block is optionally (but typically) further divided into a plurality of pages and/or word lines and/or sectors. While erasure of a storage medium is performed on a block basis, in many embodiments, reading and programming of the storage medium is performed on a smaller subunit of a block (e.g., on a page basis, word line basis, or sector basis). In some embodiments, the smaller subunit of a block consists of multiple memory cells (e.g., single-level cells or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called fast page), and (2) an upper page (sometimes called slow page).

Figure 2:
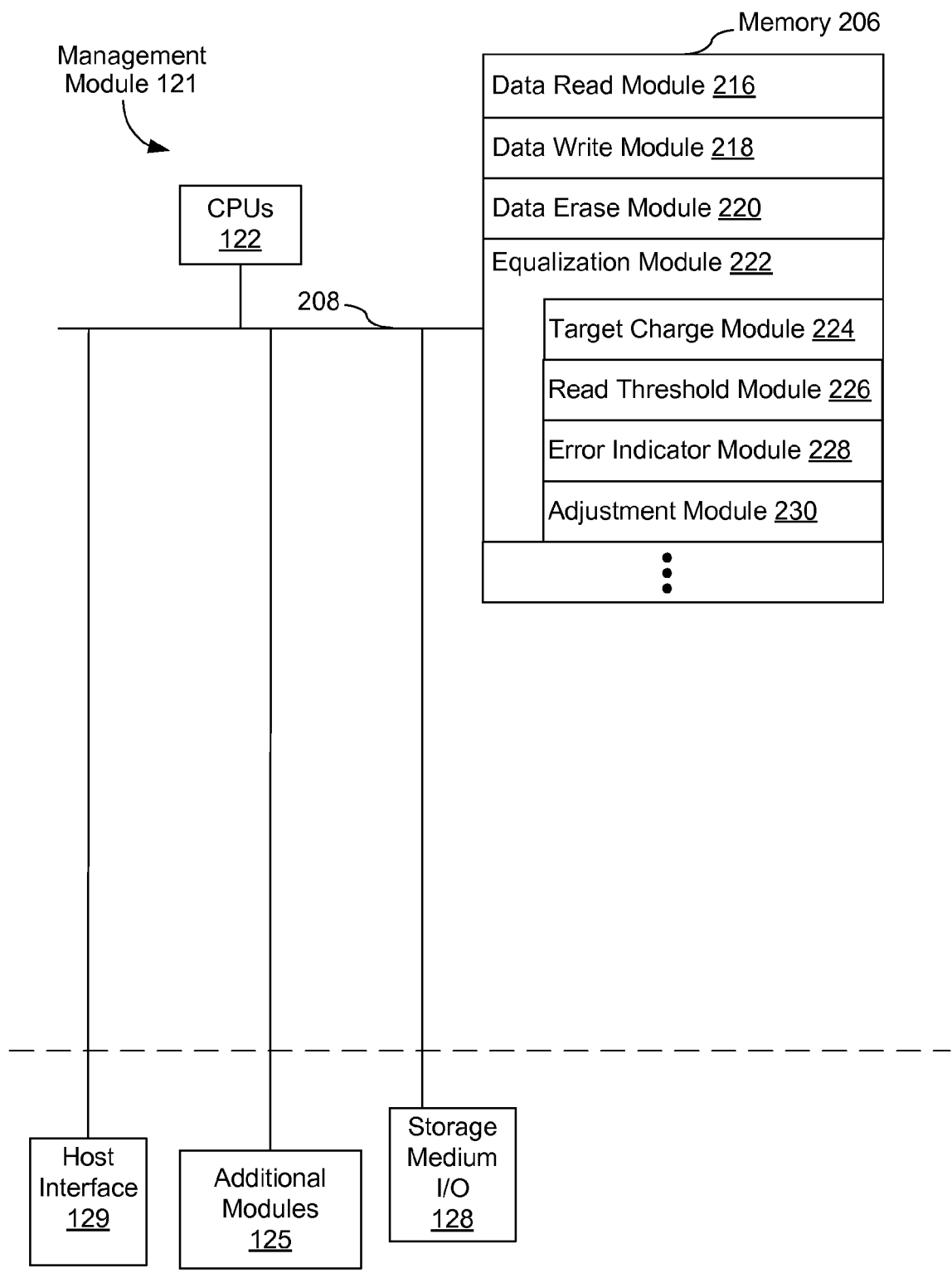
FIG. 2 is a block diagram illustrating an implementation of a management module, in accordance with some embodiments.

FIG. 2 is a block diagram illustrating an exemplary management module 121, in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to host interface 129, additional module(s) 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- data read module 216 that is used for reading data from one or more blocks in a storage medium;
- data write module 218 that is used for writing data to one or more blocks in a storage medium;
- data erase module 220 that is used for erasing data from one or more blocks in a storage medium;
- equalization module 222 that is used for adjusting one or more target charges and/or adjusting one of more read thresholds in accordance with two or more error indicators, optionally including:
  - target charge module 224 that is used for determining one or more target charges used for controlling charge distributions in cells of a storage medium when data is written to the cells;
  - read threshold module 226 that is used for determining one or more read thresholds used for reading values in cells of a storage medium when data is read from the cells;
  - error indicator module 228 that is used for determining one or more error indicators of a storage medium (e.g., a first error indicator for lower/fast pages of the storage medium and a second error indicator for upper/slow pages of the storage medium); and
  - adjustment module 230 that is used for adjusting one or more target charges and/or adjusting one or more read thresholds in accordance with two or more error indicators (e.g., determined by error indicator module 228).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 5A-5G.

Although FIG. 2 shows management module 121 in accordance with some embodiments, FIG. 2 is intended more as a functional description of the various features which may be present in management module 121 than as a structural schematic of the embodiments described herein. In practice, and as recognized by those of ordinary skill in the art, items shown separately could be combined and some items could be separated.

As discussed below with reference to FIG. 3A, a single-level flash memory cell (SLC) stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Figure 3A:
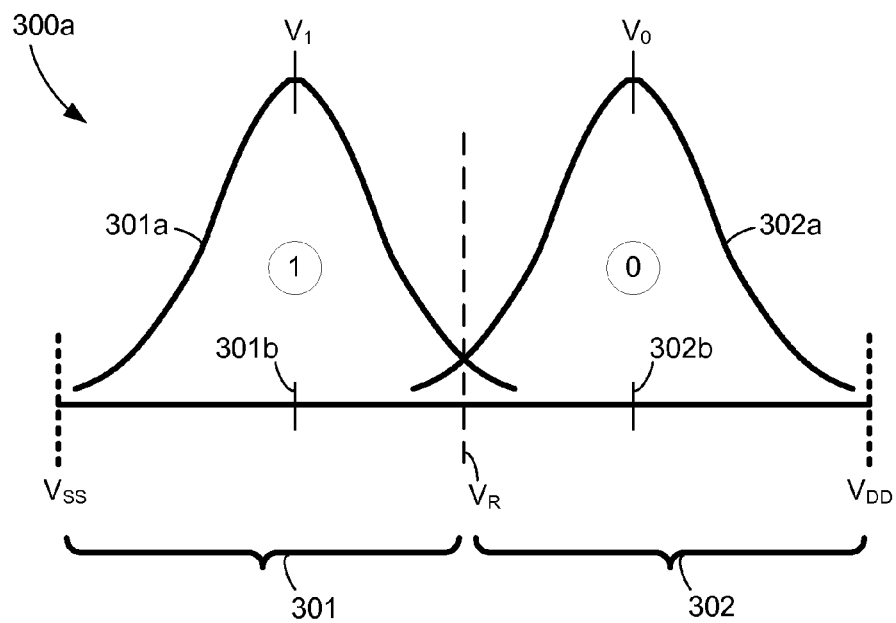
FIG. 3A is a prophetic diagram of voltage distributions that may be found in a single-level flash memory cell (SLC) over time, in accordance with some embodiments.

FIG. 3A is a simplified, prophetic diagram of voltage distributions 300a found in a single-level flash memory cell (SLC) over time, in accordance with some embodiments. The voltage distributions 300a shown in FIG. 3A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300a extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltage is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
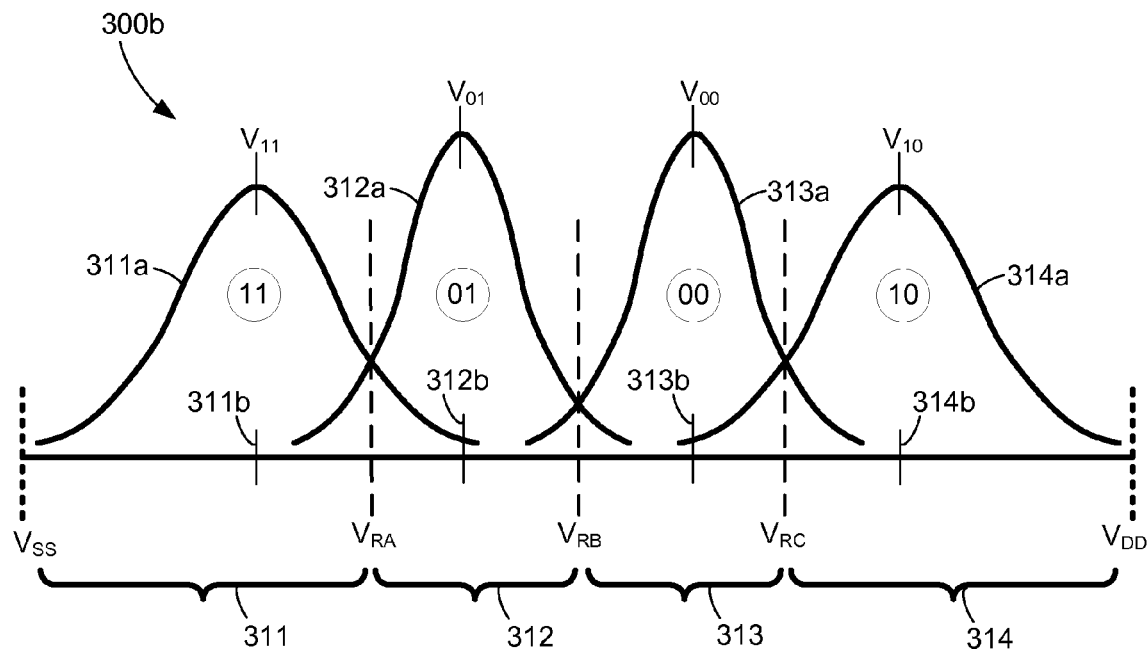
FIG. 3B is a prophetic diagram of voltage distributions that may be found in a multi-level flash memory cell (MLC) over time, in accordance with some embodiments.

FIG. 3B is a simplified, prophetic diagram of voltage distributions 300b found in a multi-level flash memory cell (MLC) over time, in accordance with some embodiments. The voltage distributions 300b shown in FIG. 3B have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 300b extend between $V_{SS}$ and $V_{DD}$.

Sequential voltage ranges 311, 312, 313, 314 between the source voltage $V_{SS}$ and drain voltages $V_{DD}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

The following describes an example in which q=2 (i.e., 2 bits per cell in a MLC flash memory). However, those skilled in the art will appreciate that the 2-bit implementation may be extended to other types of MLC flash memory that have more bits (q≥3) per memory cell.

With respect to MLC flash memory (e.g., storage media 130, FIG. 1), there are generally two types of read operations that may be performed on MLC flash. One is a single-page read, which includes reading the respective bits of a particular page from a number of q-page MLC flash memory cells. For example, for a 2-page flash memory, the two constituent pages are referred to as the lower page (sometimes called the fast page) and the upper page (sometimes called the slow page), where the lower page bit is typically the least significant bit of the 2-bit bit-tuple, and the upper page is the most significant bit. For the single-page read scenario, one of the upper page and lower page bit from a number of MLC flash memory cells is read. Thus, a lower-page read delivers a sequence of respective lower-page bits from a number of 2-page MLC flash memory cells. The other type of read is a joint-page read, which generally includes reading the respective bits of two or more pages from a number of q-page MLC flash memory cells. So, for a 2-page (i.e., q=2) flash memory, a joint-page read delivers a sequence of respective 2-bit bit-tuples from a number of 2-page MLC flash memory cells.

Similarly, with respect to MLC flash memory, there are generally two types of write operations that may be performed on MLC flash. One is a single-page write, which includes programming the respective bits of a particular page from a number of q-page MLC flash memory cells. For example, for a 2-page flash memory, a lower-page write operation programs the lower page bits of the memory cells and an upper-page write operation programs the upper page bits of the memory cells. The other type of write is a joint-page write, which generally includes programming the respective bits of two or more pages for a number of q-page MLC flash memory cells. So, for a 2-page (i.e., q=2) flash memory, a joint-page write programs both the lower page and upper page bits.

Figure 4:
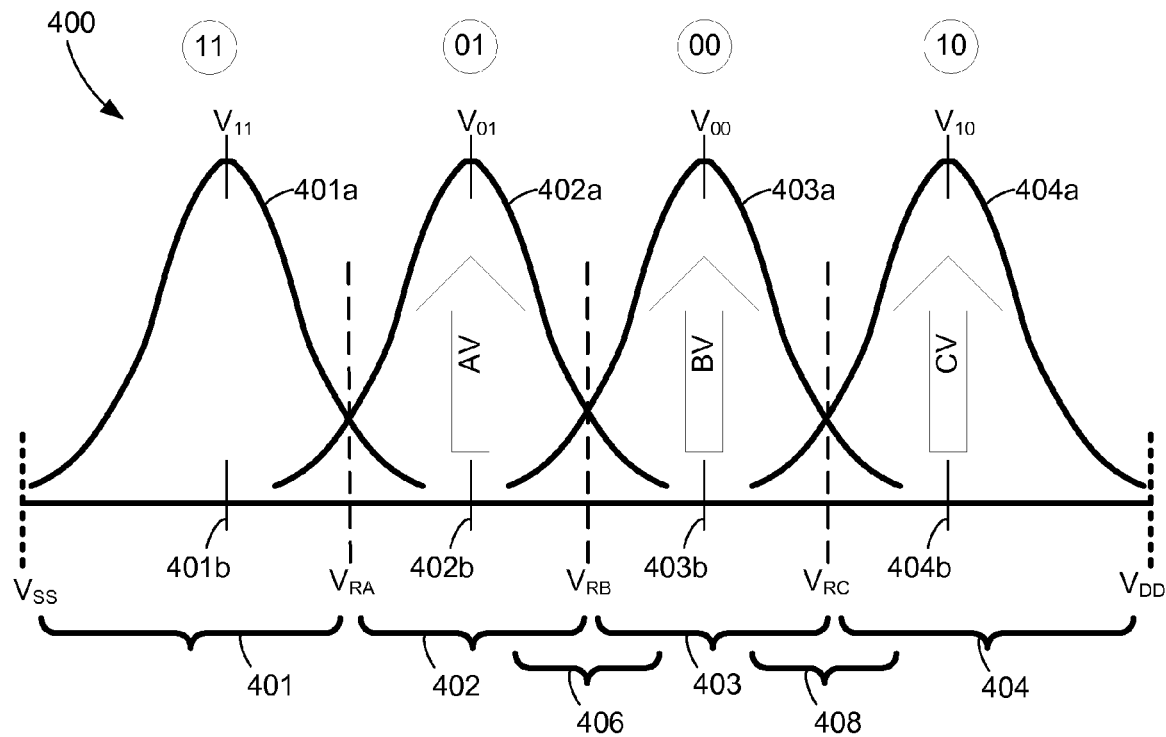
FIG. 4 is a prophetic diagram of voltage distributions that may be found in a multi-level flash memory cell (MLC) over time, in accordance with some embodiments.
Figure 5A:
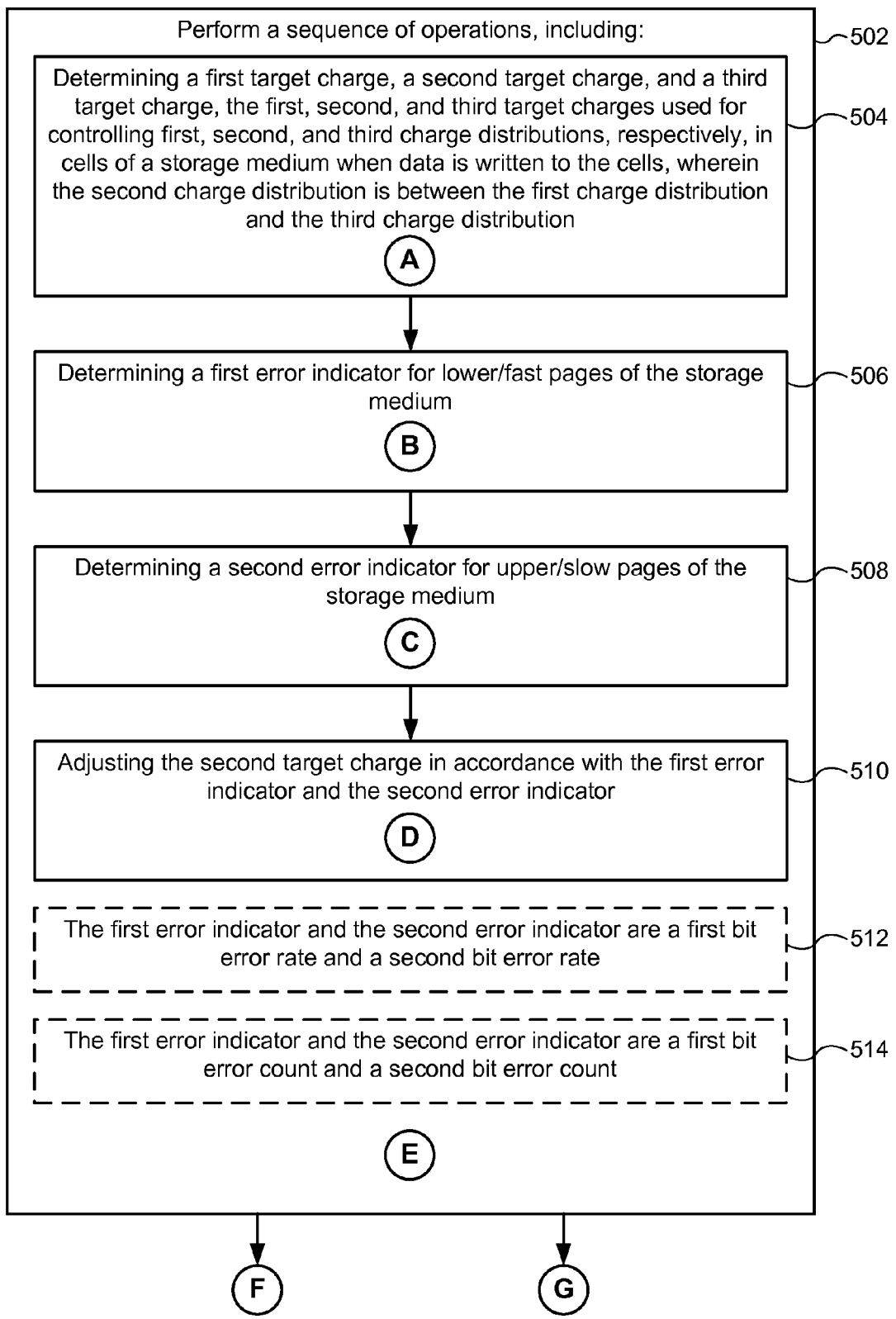
FIGS. 5A-5G illustrate a flowchart representation of a method of setting target charges for a storage medium in a storage system, in accordance with some embodiments.
Figure 5B:
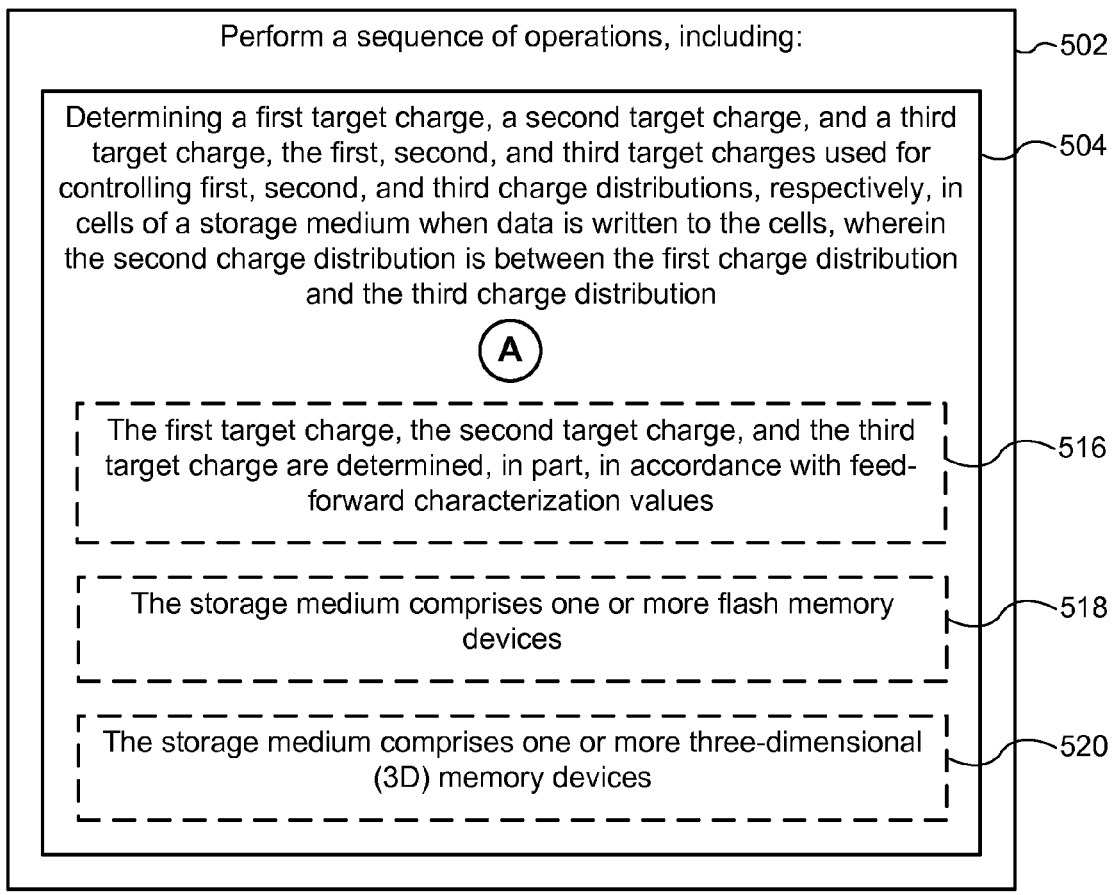
Figure 5C:
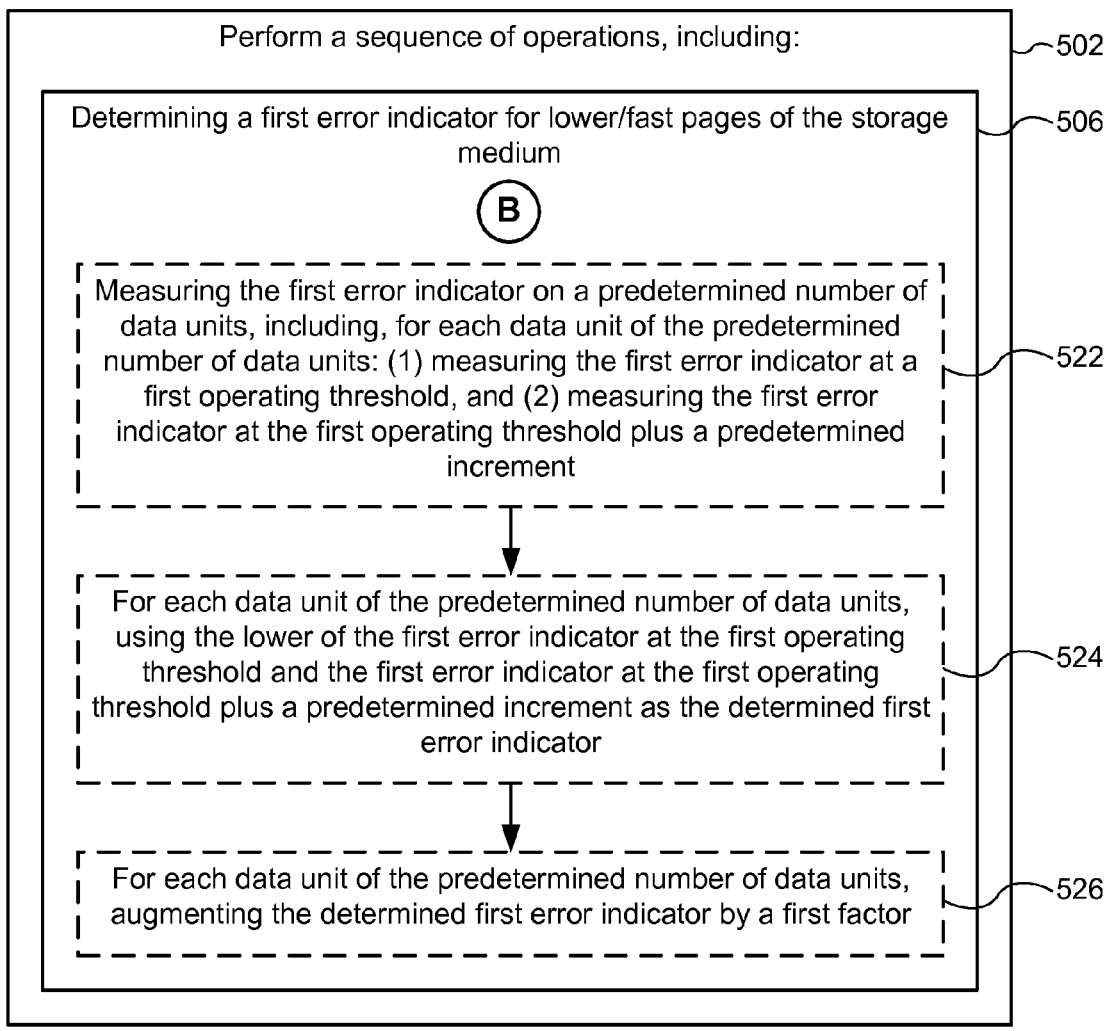
Figure 5D:
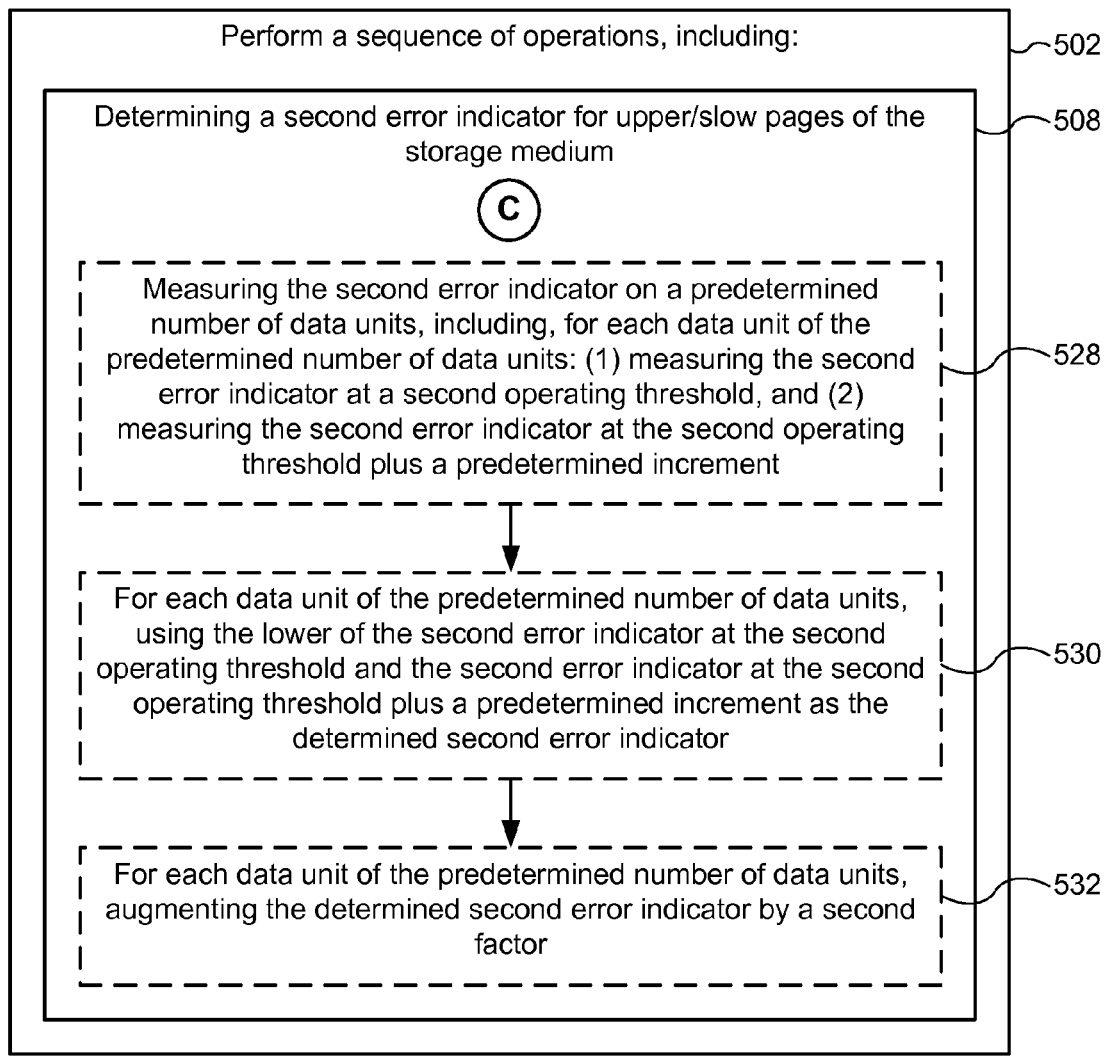
Figure 5E:
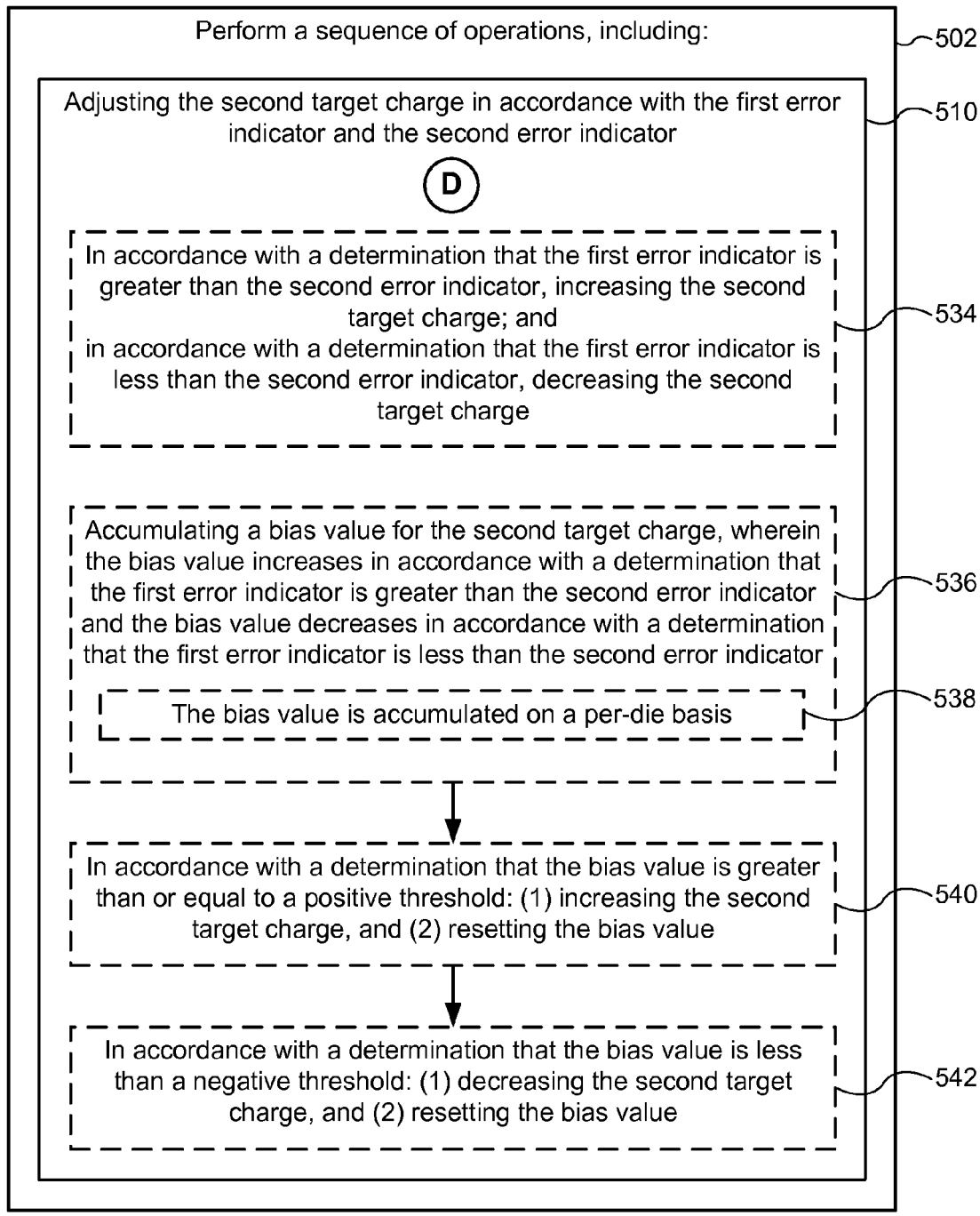
Figure 5F:
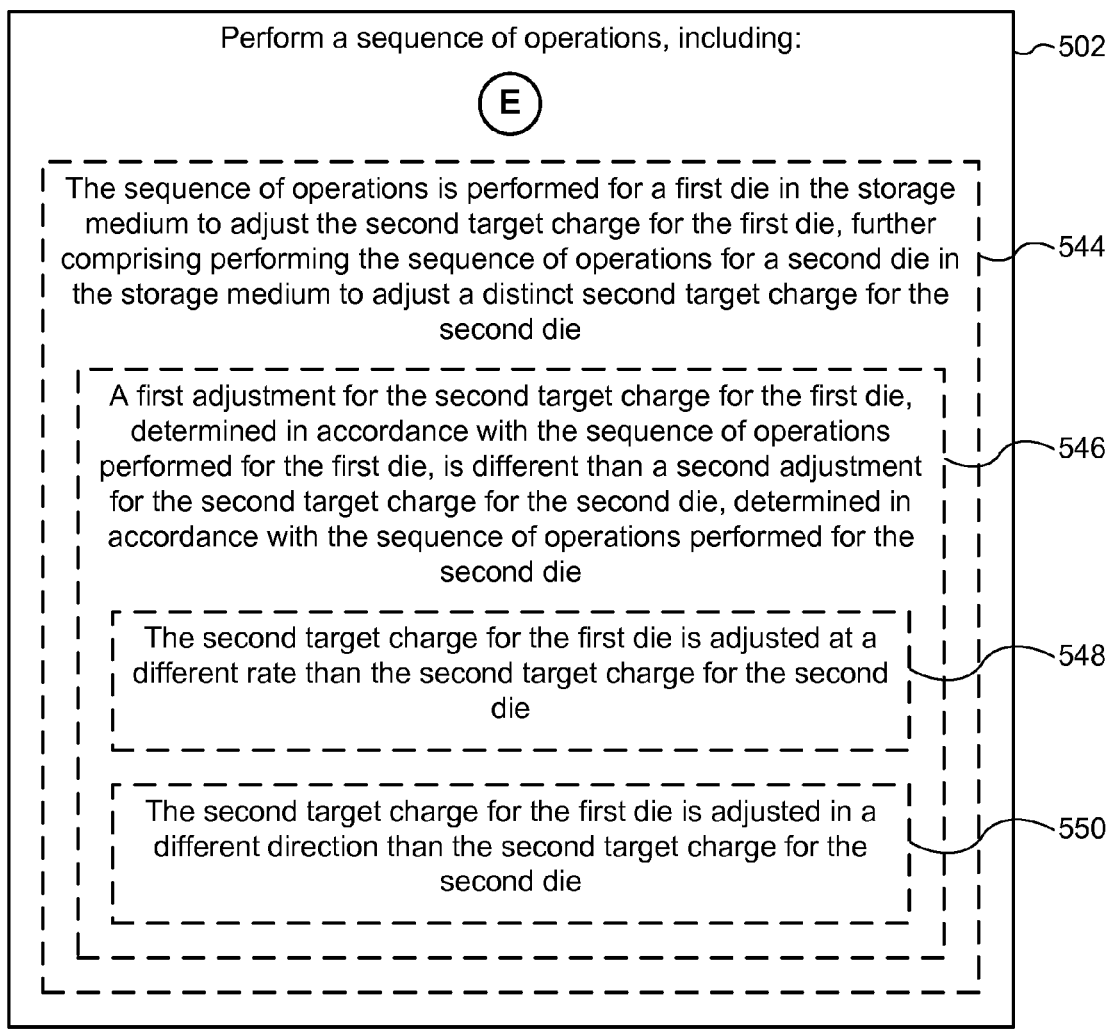
Figure 5G:
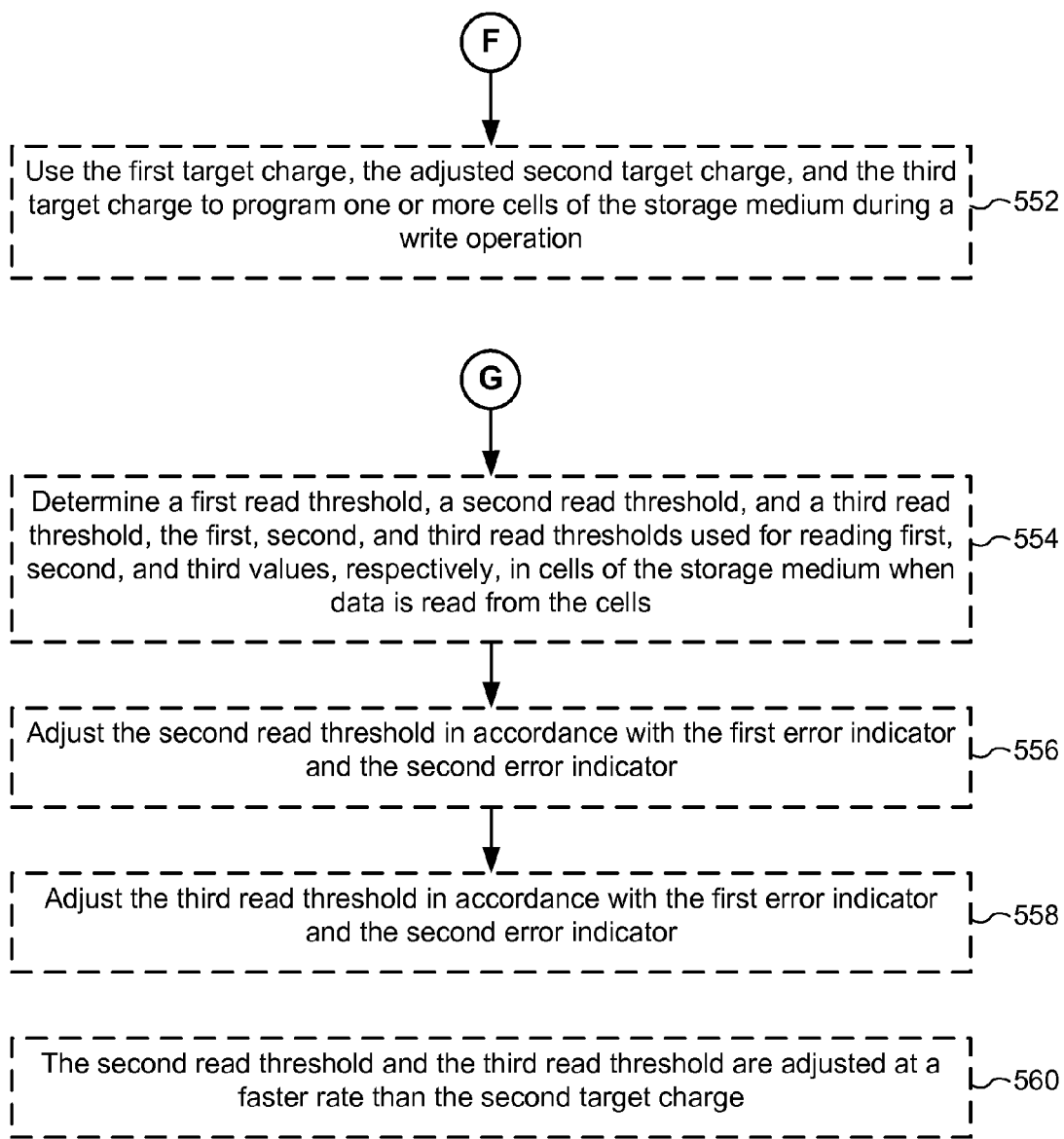

FIG. 4 is a prophetic diagram of voltage distributions 400 that may be found in a multi-level flash memory cell (MLC) over time, in accordance with some embodiments. The voltage distributions 400 shown in FIG. 4 have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 400 extend between $V_{SS}$ and $V_{DD}$.

Sequential voltage ranges 401, 402, 403, 404 between the source voltage $V_{SS}$ and drain voltages $V_{DD}$ are used to represent corresponding values "11," "01," "00," "10," respectively. Each voltage range 401, 402, 403, 404 has a respective center voltage 401b, 402b, 403b, 404b. Each voltage range 401, 402, 403, 404 also has a respective voltage distribution 401a, 402a, 403a, 404a (sometimes called charge distributions) that may occur as a result of any number of a combination of factors, such as imprecise programming, electrical fluctuations, defects in the storage medium, operating conditions, device history (e.g., number of program-erase (PE) cycles), and/or imperfect performance or design of write-read circuitry. Typically, over the thousands of cells that make up a page, block, or die, when a given value is programmed into the cells, there is a roughly normal distribution of charge around the ideal point (e.g., 402b, 403b, or 404b).

Ideally, during a write operation, the charge on the floating gate of the MLC would be set such that the resultant cell voltage is at the center of one of the ranges 401, 402, 403, 404 in order to write the corresponding bit-tuple to the MLC. Specifically, the resultant cell voltage would be set to one of $V_{11}$ 401b, $V_{01}$ 402b, $V_{00}$ 403b and $V_{10}$ 404b in order to write a corresponding one of the bit-tuples "11," "01," "00," and "10." In reality, due to the factors mentioned above, the initial cell voltage may differ from the center voltage for the data written to the MLC. In some embodiments, bit-tuple "11" represents an erased state.

A-Verify (AV), B-Verify (BV), and C-Verify (CV) (sometimes called target charges) help control placement of charge distributions 402a, 403a, and 404a, respectively. Specifically, AV is set to $V_{01}$ 402b in order to write "01," BV is set to $V_{00}$ 403b in order to write "00," and CV is set to $V_{10}$ 404b in order to write "10." Further, if one of the target charges is decreased (e.g., moved to the left or moved closer to $V_{SS}$) or increased (e.g., moved to the right or moved closer to $V_{DD}$), the corresponding charge distribution (e.g., 402a, 403a, or 404a) and center voltage (e.g., 402b, 403b, or 404b) moves accordingly. For example, in some embodiments, if BV is decreased (e.g., moved to the left or moved closer to $V_{SS}$), charge distribution 403a and corresponding center voltage 403b move to the left, in accordance with BV. As another example, in some embodiments, if BV is increased (e.g., moved to the right or moved closer to $V_{DD}$), charge distribution 403a and corresponding center voltage 403b move to the right, in accordance with BV.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 401, 402, 403, 404. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 401b, $V_{01}$ 402b, $V_{00}$ 403b or $V_{10}$ 404b corresponding to the data value written into the cell. For example, the actual cell voltage may be in an altogether different voltage range, strongly indicating that the MLC is storing a different value than was written to the MLC. More commonly, the actual cell voltage may be close to one of the read comparison voltages, making it difficult to determine with certainty which of two adjacent values is stored by the MLC.

A MLC has two page types: (1) a lower page (sometimes called fast page), and (2) an upper page (sometimes called slow page). In some embodiments, the lower page bit is typically the least significant bit of the 2-bit bit-tuple, and the upper page is the most significant bit. In some embodiments, the lower/fast page value is discerned using a single reading threshold voltage (e.g., reading threshold voltage $V_{RB}$). As shown in FIG. 4, charges to the left of reading threshold voltage $V_{RB}$ have a one value for the lower/fast page (e.g., the least significant bit of "11" and "01" is "1"), and charges to the right of reading threshold voltage $V_{RB}$ have a zero value for the lower/fast page (e.g., the least significant bit of "00" and "10" is "0"). In some embodiments, the upper/slow page value is discerned using two reading threshold voltages (e.g., reading threshold voltage $V_{RA}$ and reading threshold voltage $V_{RC}$). As shown in FIG. 4, charges between reading threshold voltage $V_{RA}$ and reading threshold voltage $V_{RC}$ have a zero value for the upper/slow page (e.g., the most significant bit of "01" and "00" is "0") and charges below reading threshold voltage $V_{RA}$ and charges above reading threshold voltage $V_{RC}$ have a one value for the upper/slow page (e.g., the most significant bit of "11" and "10" is "1").

In FIG. 4, overlap 406 of voltage distributions 402a and 403a indicates a range of memory cell voltages (or charge levels) in which errors occur when reading from the memory cell at reading threshold voltage $V_{RB}$. Similarly, overlap 408 of voltage distributions 403a and 404a indicates a range of memory cell voltages in which errors occur when reading from the memory cell at reading threshold voltage $V_{RC}$. Since, as discussed above, reading threshold voltage $V_{RB}$ is used to determine the lower/fast page value, in some embodiments, the size of overlap 406 corresponds to the likelihood of errors occurring when reading the lower/fast page. Similarly, reading threshold voltage $V_{RC}$ is used, in part, to determine the upper/slow page value, so in some embodiments, overlap 408 corresponds to the likelihood of errors occurring when reading the upper/slow page. In some embodiments, an error indicator (e.g., for a respective page or other portion of a memory device) is a bit error rate (BER). In some embodiments, an error indicator is a bit error count (BEC).

In some embodiments, if BV is decreased (e.g., moved to the left or moved closer to $V_{SS}$), charge distribution 403a and corresponding center voltage 403b move to the left, in accordance with BV. If charge distributions 402a and 404a remain unchanged, overlap 406 increases and overlap 408 decreases, resulting in an increase in lower/fast page bit errors and a decrease in upper/slow page bit errors. As another example, in some embodiments, if BV is increased (e.g., moved to the right or moved closer to $V_{DD}$), charge distribution 403a and corresponding center voltage 403b move to the right, in accordance with BV. If charge distributions 402a and 404a remain unchanged, overlap 406 decreases and overlap 408 increases, resulting in a decrease in lower/fast page bit errors and an increase in upper/slow page bit errors.

In some embodiments, increasing or decreasing BV equalizes (e.g., reduces the difference between) the errors between lower/fast pages and upper/slow pages, as discussed below with respect to FIG. 5A-5G. Equalizing the error rates is important because a memory device fails when it is unable to return data to a host. If the error rates on lower/fast pages and upper/slow pages are unequal, the memory device fails when the page-type (e.g., either the lower/fast page or the upper/slow page) with the higher error rate (or count) fails to read. By equalizing the error rates (or counts) between lower/fast pages and upper/slow pages, the page-type with the higher error rate is given extra margin while taking "wasted margin" from the page-type with the lower error rate, thus extending the life of the memory device.

Although the examples herein use a 2-page MLC flash memory and equalize errors by adjusting BV, this scheme is applicable to other types of memory (e.g., Triple-Level Cell (TLC) flash memory with 3 bits per cell or other types of memory with 4 or more bits per cell) by adjusting other target charges (e.g., AV and CV) accordingly.

FIGS. 5A-5G illustrate a flowchart representation of method 500 of setting target charges for a storage medium in a storage system, in accordance with some embodiments. At least in some embodiments, method 500 is performed by a storage system (e.g., data storage system 100, FIG. 1) or one or more components of the storage system (e.g., storage controller 120 and/or storage medium 130, FIG. 1), where the storage system is operatively coupled with a host system (e.g., computer system 110, FIG. 1). In some embodiments, method 500 is governed by instructions that are stored in a non-transitory computer readable storage medium and that are executed by one or more processors of a device, such as the one or more processing units (CPUs) 122 of management module 121, shown in FIGS. 1 and 2.

A storage system (e.g., data storage system 100, FIG. 1) performs (502) a sequence of operations, including: (1) determining (504) a first target charge, a second target charge, and a third target charge, the first, second, and third target charges used for controlling first, second, and third charge distributions, respectively, in cells of the storage medium when data is written to the cells, wherein the second charge distribution is between the first charge distribution and the third charge distribution, (2) determining (506) a first error indicator for lower/fast pages of the storage medium, (3) determining (508) a second error indicator for upper/slow pages of the storage medium, and (4) adjusting (510) the second target charge in accordance with the first error indicator and the second error indicator.

In some embodiments, an equalization module (e.g., equalization module 222, FIG. 2) is used to perform (502) the sequence of operations 504, 506, 508, 510. Equalization module 222 is described above with respect to FIG. 2. More specifically, in some embodiments, target charge module 224 performs operation 504 (determining (504) a first target charge, a second target charge, and a third target charge, the first, second, and third target charges used for controlling first, second, and third charge distributions, respectively, in cells of the storage medium when data is written to the cells, wherein the second charge distribution is between the first charge distribution and the third charge distribution). Similarly, in some embodiments, error indicator module 228 performs operations 506 and 508 (determining (506) a first error indicator for lower/fast pages of the storage medium, and determining (508) a second error indicator for upper/slow pages of the storage medium). Further, in some embodiments, adjustment module 230 performs operation 510 (adjusting (510) the second target charge in accordance with the first error indicator and the second error indicator).

The storage system determines (504) a first target charge (e.g., AV, FIG. 4), a second target charge (e.g., BV, FIG. 4), and a third target charge (e.g., CV, FIG. 4), the first, second, and third target charges used for controlling first, second, and third charge distributions, respectively (e.g., charge distributions 402a, 403a, and 404a, respectively, FIG. 4), in cells of the storage medium when data is written to the cells, wherein the second charge distribution (e.g., charge distribution 403a, FIG. 4) is between the first charge distribution (e.g., charge distribution 402a, FIG. 4) and the third charge distribution (e.g., charge distribution 404a, FIG. 4). In some embodiments, determining a first target charge, a second target charge, and a third target charge includes determining the first, second, and third target charges based on external flash characterization techniques during production. For example, in some embodiments, for a given die in the storage medium (e.g., storage medium 130, FIG. 1), characterization of the die during production determines the starting values of the first, second, and third target charges. In some embodiments, a target charge module (e.g., target charge module 224, FIG. 2) is used to determine a first target charge, a second target charge, and a third target charge, the first, second, and third target charges used for controlling first, second, and third charge distributions, respectively, in cells of the storage medium when data is written to the cells, wherein the second charge distribution is between the first charge distribution and the third charge distribution, as described above with respect to FIG. 2.

In some embodiments, the first target charge, the second target charge, and the third target charge are (516) determined, in part, in accordance with feed-forward characterization values. In some embodiments, determining, in part, the first target charge, the second target charge, and the third target charge, in accordance with feed-forward characterization values includes adjusting the first, second, and third target charges (e.g., AV, BV, and CV, respectively, FIG. 4) as the storage medium (e.g., storage medium 130, FIG. 1) wears, to account for changing programming characteristics as the storage medium wears. In some embodiments, characterization techniques performed on the storage medium during production (e.g., prior to shipment of the storage medium) are used to gain knowledge of how the storage medium performs over time and to define feed-forward adjustments to the target charges in order to minimize error of the charge distributions. In some embodiments, feed-forward adjustments are average feed-forward values for the average of the entire die population in the storage medium. By using only an average feed-forward setting for the entire die population in the storage medium, some outlier die may have undesirably high bit error rates. In some embodiments, the adjustment to the second target charge as described with respect to operation 510 is performed in addition to the feed-forward adjustments to the target charges as the storage medium wears.

In some embodiments, the storage medium comprises (518) one or more non-volatile storage devices, such as flash memory devices. In some embodiments, the storage medium (e.g., storage medium 130, FIG. 1) is a single flash memory device, while in other embodiments the storage medium includes a plurality of flash memory devices. In some embodiments, the non-volatile storage medium (e.g., storage medium 130, FIG. 1) includes NAND-type flash memory or NOR-type flash memory. In other embodiments, the storage medium comprises one or more other types of non-volatile storage devices.

In some embodiments, the storage medium comprises (520) one or more three-dimensional (3D) memory devices, as further defined herein. In some embodiments, the storage medium (e.g., storage medium 130, FIG. 1) is a single 3D memory device, while in other embodiments the storage medium includes a plurality of 3D memory devices.

The storage system determines (506) a first error indicator for lower/fast pages of the storage medium. In some embodiments, the first error indicator is a bit error rate. In some embodiments, the first error indicator is a bit error count. In some embodiments, the first error indicator for lower/fast pages is determined by the overlap (e.g., overlap 406, FIG. 4) between the first charge distribution (e.g., charge distribution 402a, FIG. 4) and the second charge distribution (e.g., charge distribution 403a, FIG. 4). In some embodiments, the first error indicator is determined on a periodic basis (e.g., every 32 program-erase cycles). In some embodiments, an error indicator module (e.g., error indicator module 228, FIG. 2) is used to determine a first error indicator for lower/fast pages of the storage medium, as described above with respect to FIG. 2.

In some embodiments, determining (506) the first error indicator for lower/fast pages includes measuring (522) the first error indicator on a predetermined number of data units, including, for each data unit of the predetermined number of data units: (1) measuring the first error indicator at a first operating threshold, and (2) measuring the first error indicator at the first operating threshold plus a predetermined increment. In some embodiments, a data unit is a word line. In some embodiments, a data unit is the minimum unit that is sent to an ECC module. In some embodiments, for example, the predetermined number of data units is eight word lines, and for each word line of the eight word lines, the first error indicator for lower/fast pages is measured at a first operating threshold (e.g., at reading threshold voltage $V_{RB}$, FIG. 4) and the first error indicator for lower/fast pages is measured at the first operating threshold plus a predetermined increment (e.g., at reading threshold voltage $V_{RB}$ plus 2 steps). In some embodiments, the predetermined increment is in units of digital-to-analog converter (DAC) steps.

In some embodiments, determining (506) the first error indicator for lower/fast pages further includes, for each data unit of the predetermined number of data units, using (524) the lower of the first error indicator at the first operating threshold and the first error indicator at the first operating threshold plus a predetermined increment as the determined first error indicator. For example, if the error indicators are expressed as bit error counts, for a given data unit of the predetermined number of data units, if the first error indicator measured at the first operating threshold (e.g., at reading threshold voltage $V_{RB}$, FIG. 4) is 25 and if the first error indicator measured at the first operating threshold plus a predetermined increment (e.g., at reading threshold voltage $V_{RB}$ plus 2 steps) is 33, the storage system uses 25 as the determined first error indicator.

In some embodiments, determining (506) the first error indicator for lower/fast pages further includes, for each data unit of the predetermined number of data units, augmenting (526) the determined first error indicator by a first factor. In some embodiments, augmenting the determined first error indicator by the first factor increases the first error indicator to account for error indicator increases with retention time (e.g., if power is removed from the storage system and data is not refreshed for a period of time). In some embodiments, the first factor is determined by device characterization which indicates BER increases with retention time. In some embodiments, BER increases are unequal between lower/fast and upper/slow pages. For example, in some embodiments, lower/fast pages may experience a BER increase at a rate 1.2 times the upper/slow page BER increase.

The storage system determines (508) a second error indicator for upper/slow pages of the storage medium. In some embodiments, the second error indicator is a bit error rate. In some embodiments, the second error indicator is a bit error count. In some embodiments, the second error indicator for upper/slow pages is determined by the overlap (e.g., overlap 408, FIG. 4) between the second charge distribution (e.g., charge distribution 403a, FIG. 4) and the third charge distribution (e.g., charge distribution 404a, FIG. 4). In some embodiments, the second error indicator is determined on a periodic basis (e.g., every 32 program-erase cycles). In some embodiments, an error indicator module (e.g., error indicator module 228, FIG. 2) is used to determine a second error indicator for upper/slow pages of the storage medium, as described above with respect to FIG. 2.

In some embodiments, determining (508) the second error indicator for upper/slow pages includes measuring (528) the second error indicator on a predetermined number of data units, including, for each data unit of the predetermined number of data units: (1) measuring the second error indicator at a second operating threshold, and (2) measuring the second error indicator at the second operating threshold plus a predetermined increment. In some embodiments, a data unit is a word line. In some embodiments, a data unit is the minimum unit that is sent to an ECC module. In some embodiments, for example, the predetermined number of data units is eight word lines, and for each word line of the eight word lines, the second error indicator for upper/slow pages is measured at a second operating threshold (e.g., at reading threshold voltage $V_{RC}$, FIG. 4) and the second error indicator for upper/slow pages is measured at the second operating threshold plus a predetermined increment (e.g., at reading threshold voltage $V_{RC}$ plus 2 steps). In some embodiments, the predetermined increment is in units of digital-to-analog converter (DAC) steps.

In some embodiments, determining (508) the second error indicator for upper/slow pages further includes, for each data unit of the predetermined number of data units, using (530) the lower of the second error indicator at the second operating threshold and the second error indicator at the second operating threshold plus a predetermined increment as the determined second error indicator. For example, if the error indicators are expressed as bit error counts, for a given data unit of the predetermined number of data units, if the second error indicator measured at the second operating threshold (e.g., at reading threshold voltage $V_{RC}$, FIG. 4) is 42 and if the second error indicator measured at the second operating threshold plus a predetermined increment (e.g., at reading threshold voltage $V_{RC}$ plus 2 steps) is 37, the storage system uses 37 as the determined second error indicator.

In some embodiments, determining (508) the second error indicator for upper/slow pages further includes, for each data unit of the predetermined number of data units, augmenting (532) the determined second error indicator by a second factor. In some embodiments, augmenting the determined second error indicator by the second factor increases the second error indicator to account for error indicator increases with retention time (e.g., if power is removed from the storage system and data is not refreshed for a period of time). In some embodiments, the second factor is determined by device characterization which indicates BER increases with retention time. In some embodiments, BER increases are unequal between lower/fast and upper/slow pages. For example, in some embodiments, upper/slow pages may experience a BER increase at a rate 1.2 times the lower/fast page BER increase.

The storage system adjusts (510) the second target charge (e.g., BV, FIG. 4) in accordance with the first error indicator and the second error indicator. In some embodiments, the second target charge is adjusted, in accordance with the first error indicator and the second error indicator, to equalize the first error indicator and the second error indicator, wherein equalizing the first error indicator and the second error indicator includes reducing the difference between the first error indicator and the second error indicator. In some embodiments, an adjustment module (e.g., adjustment module 230, FIG. 2) is used to adjust the second target charge in accordance with the first error indicator and the second error indicator, as described above with respect to FIG. 2.

In some embodiments, adjusting (510) the second target charge (e.g., BV, FIG. 4) in accordance with the first error indicator and the second error indicator includes: (1) in accordance with a determination that the first error indicator is greater than the second error indicator, increasing (534) the second target charge, and (2) in accordance with a determination that the first error indicator is less than the second error indicator, decreasing the second target charge. As discussed above with respect to FIG. 4, overlap 406 is representative of the first error indicator for the lower/fast pages and overlap 408 is representative of the second error indicator for the upper/slow pages. In some embodiments, if the first error indicator is greater than the second error indicator (e.g., overlap 406 is greater than overlap 408, FIG. 4), then in some embodiments, the second target charge (e.g., BV, FIG. 4) is increased. In some embodiments, increasing the second target charge reduces the first error indicator (e.g., reduces overlap 406, FIG. 4) and increases the second error indicator (e.g., increases overlap 408, FIG. 4). In some embodiments, if the first error indicator is less than the second error indicator (e.g., overlap 406 is less than overlap 408, FIG. 4), then in some embodiments, the second target charge (e.g., BV, FIG. 4) is decreased. In some embodiments, decreasing the second target charge increases the first error indicator (e.g., increases overlap 406, FIG. 4) and decreases the second error indicator (e.g., decreases overlap 408, FIG. 4).

In some embodiments, adjusting (510) the second target charge in accordance with the first error indicator and the second error indicator includes accumulating (536) a bias value for the second target charge, wherein the bias value increases in accordance with a determination that the first error indicator is greater than the second error indicator and the bias value decreases in accordance with a determination that the first error indicator is less than the second error indicator. In some embodiments, the bias value is accumulated by comparing each determined first error indicator with each respective determined second error indicator, on each predetermined number of data units, for each periodic basis. For example, in some embodiments, every 32 program-erase cycles, the first error indicator and second error indicator are determined over 8 word lines, and each pair is compared. In some embodiments, for each first error indicator/second error indicator pair, the bias value is increased in accordance with a determination that the first error indicator is greater than the second error indicator. In some embodiments, the bias value is increased in proportion to the size of the difference between the first error indicator and the second error indicator. In some embodiments, for each first error indicator/second error indicator pair, the bias value is decreased in accordance with a determination that the first error indicator is less than the second error indicator. In some embodiments, the bias value is decreased in proportion to the size of the difference between the first error indicator and the second error indicator.

In some embodiments, the bias value is (538) accumulated on a per-die basis. In some embodiments, there is a distinct bias value for each die of the storage medium (storage medium 130, FIG. 1).

In some embodiments, adjusting (510) the second target charge in accordance with the first error indicator and the second error indicator further includes, in accordance with a determination that the bias value is greater than or equal to a positive threshold: (1) increasing (540) the second target charge, and (2) resetting the bias value. In some embodiments, determining that the bias value is greater than or equal to a positive threshold (e.g., 6000) is equivalent to determining that the bias value is greater than another positive threshold (e.g., 5999). In some embodiments, resetting the bias value includes subtracting the positive threshold from the bias value. For example, in some embodiments, if the bias value is 6007 and the positive threshold is 6000, after resetting the bias value, the bias value equals 7 (e.g., 6007-6000). In some embodiments, resetting the bias value includes another method to reduce the bias value magnitude (e.g., dividing the bias value by a predetermined number).

In some embodiments, adjusting (510) the second target charge in accordance with the first error indicator and the second error indicator further includes, in accordance with a determination that the bias value is less than a negative threshold: (1) decreasing (542) the second target charge, and (2) resetting the bias value. In some embodiments, determining that the bias value is less than a negative threshold (e.g., −6000) is equivalent to determining that the bias value is less than or equal to another negative threshold (e.g., −6001). In some embodiments, resetting the bias value includes subtracting the negative threshold from the bias value. For example, in some embodiments, if the bias value is −6008 and the negative threshold is −6000, after resetting the bias value, the bias value equals −8 (e.g., −6008−(−6000)). In some embodiments, resetting the bias value includes another method to reduce the bias value magnitude (e.g., dividing the bias value by a predetermined number).

In some embodiments, the positive threshold and negative threshold are scaled to increase the second target charge at a different rate than to decrease the second target charge. For example, if the positive threshold is 6000 and the negative threshold is −8000, the bias value will be increased at a faster rate than it is decreased.

In some embodiments, the first error indicator and the second error indicator are (512) a first bit error rate and a second bit error rate. In some embodiments, a bit error rate is the number of bit errors divided by the total number of transferred bits during a predetermined time interval. In some embodiments, a bit error rate is a unit-less performance measure. In some embodiments, a bit error rate is expressed as a percentage.

In some embodiments, the first error indicator and the second error indicator are (514) a first bit error count and a second bit error count. In some embodiments, a bit error count is the total number of bit errors during a predetermined time interval.

In some embodiments, the sequence of operations is (544) performed for a first die in the storage medium to adjust the second target charge for the first die, further comprising performing the sequence of operations for a second die in the storage medium to adjust a distinct second target charge for the second die. In some embodiments, an equalization module (e.g., equalization module 222, FIG. 2) is used to perform the sequence of operations for a first die in the storage medium to adjust the second target charge for the first die and to perform the sequence of operations for a second die in the storage medium to adjust a distinct second target charge for the second die, as described above with respect to FIG. 2.

In some embodiments, a first adjustment for the second target charge for the first die, determined in accordance with the sequence of operations performed for the first die, is (546) different than a second adjustment for the second target charge for the second die, determined in accordance with the sequence of operations performed for the second die.

In some embodiments, the second target charge for the first die is (548) adjusted at a different rate than the second target charge for the second die. In some circumstances, for example, the second target charge for the first die is adjusted at a faster rate than the second target charge for the second die. In some other circumstances, for example, the second target charge for the first die is adjusted at a slower rate than the second target charge for the second die.

In some embodiments, the second target charge for the first die is (550) adjusted in a different direction than the second target charge for the second die. In some circumstances, for example, the second target charge for the first die is decreased while the second target charge for the second die is increased. In some other circumstances, for example, the second target charge for the first die is increased while the second target charge for the second die is decreased.

In some embodiments, the storage system uses (552) the first target charge, the adjusted second target charge, and the third target charge to program one or more cells of the storage medium during a write operation. In some embodiments, a data write module (e.g., data write module 218, FIG. 2) is used to program one or more cells of the storage medium during a write operation using the first target charge, the adjusted second target charge, and the third target charge.

In some embodiments, the storage system determines (554) a first read threshold, a second read threshold, and a third read threshold, the first, second, and third read thresholds used for reading first, second, and third values, respectively, in cells of the storage medium when data is read from the cells. In some embodiments, the first read threshold is lower than the second read threshold. In some embodiments, the second read threshold is lower than the third read threshold. In some embodiments, the second read threshold is used to discern the value of a lower/fast page. For example, in some embodiments, charges to the left of the second read threshold is a one value for the fast page and charges to the right of the second read threshold is a zero value for the fast page, as described above with respect to FIG. 4. In some embodiments, the first read threshold and the third read threshold are used to discern the value of an upper/slow page. For example, in some embodiments, charges between the first read threshold and the third read threshold represent a zero value for the slow page and charges less than the first read threshold and greater than the third read threshold represent a one value for the slow page, as described above with respect to FIG. 4.

In some embodiments, the storage system adjusts (556) the second read threshold (e.g., reading threshold voltage $V_{RB}$, FIG. 4) in accordance with the first error indicator and the second error indicator. In some embodiments, the second read threshold is adjusted, in accordance with the first error indicator and the second error indicator, to equalize the first error indicator and the second error indicator, wherein equalizing the first error indicator and the second error indicator includes reducing the difference between the first error indicator and the second error indicator. The embodiments described herein for adjusting the second target charge in accordance with the first error indicator and the second error indicator (e.g., with respect to operation 510) are equally applicable to adjusting the second read threshold in accordance with the first error indicator and the second error indicator. In some embodiments, the second read threshold is adjusted in an analogous manner as the second target charge, but using different positive and negative thresholds with respect to an accumulated bias value than those used for adjusting the second target charge. For example, a second, distinct bias value would be computed for adjusting the second target charge, and the second bias value would be compared with a second positive threshold and a second negative threshold that have smaller absolute values than the positive threshold and negative threshold used for adjusting the second target charge. In one example, the positive threshold and negative threshold used for adjusting the second target charge are +6000 and −6000, respectively, while the positive threshold and negative threshold used for adjusting the second read threshold are +1000 and −1000, respectively.

For sake of brevity, the details of the bias value computation and its comparison with positive and negative thresholds are not repeated here.

In some embodiments, the storage system adjusts (558) the third read threshold (e.g., reading threshold voltage $V_{RC}$, FIG. 4) in accordance with the first error indicator and the second error indicator. In some embodiments, the third read threshold is adjusted, in accordance with the first error indicator and the second error indicator, to equalize the first error indicator and the second error indicator, wherein equalizing the first error indicator and the second error indicator includes reducing the difference between the first error indicator and the second error indicator. The embodiments described herein for adjusting the second target charge in accordance with the first error indicator and the second error indicator (e.g., with respect to operation 510) are equally applicable to adjusting the third read threshold in accordance with the first error indicator and the second error indicator.

In some embodiments, the third read threshold is adjusted in an analogous manner as the second target charge, and for sake of brevity, the details are not repeated here.

In some embodiments, the second read threshold and the third read threshold are (560) adjusted at a faster rate than the second target charge. For example, in some embodiments, the second read threshold is adjusted every 224 program-erase cycles and the second target charge is adjusted every 2240 program-erase cycles. In some embodiments, the second read threshold and the third read threshold are (560) adjusted at a faster rate than the second target charge due to the use of smaller threshold values (thresholds having smaller absolute values) for triggering adjustments to the second read threshold and the third read threshold than the threshold values used for triggering adjustments to the second target charge. In some embodiments, the read threshold adjustments described above are performed by read threshold module 226, described above with respect to FIG. 2.

In some implementations, any of the methods described above are performed by a device operable to set target charges for a storage medium, the device including (1) a storage medium interface for coupling the device to the storage medium, and (2) one or more modules, including a memory management module that includes one or more processors and memory storing one or more programs configured for execution by the one or more processors, the one or more modules coupled to the storage medium interface and configured to perform or control performance of any of the methods described above.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible (e.g., a NOR memory array). One of skill in the art will recognize that the NAND and NOR memory configurations are exemplary, and memory elements may be otherwise configured.

The semiconductor memory elements included in a single device, such as memory elements located within and/or over the same substrate or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration (e.g., in an x-z plane), thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some implementations, adjacent memory levels of a monolithic 3D memory array optionally share at least one material layer, while in other implementations adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first target charge could be termed a second target charge, and, similarly, a second target charge could be termed a first target charge, without changing the meaning of the description, so long as all occurrences of the "first target charge" are renamed consistently and all occurrences of the "second target charge" are renamed consistently. The first target charge and the second target charge are both target charges, but they are not the same target charge.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of setting target charges for a storage medium in a storage system, the method comprising:
   performing a sequence of operations, including:
      determining a first target charge, a second target charge, and a third target charge, the first, second, and third target charges used for controlling first, second, and third charge distributions, respectively, in cells of the storage medium when data is written to the cells, wherein the second charge distribution is between the first charge distribution and the third charge distribution;
      determining a first error indicator for lower/fast pages of the storage medium;
      determining a second error indicator for upper/slow pages of the storage medium; and
      adjusting the second target charge in accordance with the first error indicator and the second error indicator.

2. The method of claim 1, wherein adjusting the second target charge in accordance with the first error indicator and the second error indicator includes:
   in accordance with a determination that the first error indicator is greater than the second error indicator, increasing the second target charge; and
   in accordance with a determination that the first error indicator is less than the second error indicator, decreasing the second target charge.

3. The method of claim 1, wherein adjusting the second target charge in accordance with the first error indicator and the second error indicator includes:
  accumulating a bias value for the second target charge, wherein the bias value increases in accordance with a determination that the first error indicator is greater than the second error indicator and the bias value decreases in accordance with a determination that the first error indicator is less than the second error indicator;
  in accordance with a determination that the bias value is greater than or equal to a positive threshold:
    increasing the second target charge; and
    resetting the bias value; and
  in accordance with a determination that the bias value is less than a negative threshold:
    decreasing the second target charge; and
    resetting the bias value.

4. The method of claim 3, wherein the bias value is accumulated on a per-die basis.

5. The method of claim 1, further comprising using the first target charge, the adjusted second target charge, and the third target charge to program one or more cells of the storage medium during a write operation.

6. The method of claim 1, wherein determining the first error indicator for lower/fast pages includes:
  measuring the first error indicator on a predetermined number of data units, including:
    for each data unit of the predetermined number of data units:
      measuring the first error indicator at a first operating threshold; and
      measuring the first error indicator at the first operating threshold plus a predetermined increment.

7. The method of claim 6, further comprising, for each data unit of the predetermined number of data units, using the lower of the first error indicator at the first operating threshold and the first error indicator at the first operating threshold plus a predetermined increment as the determined first error indicator.

8. The method of claim 7, further comprising, for each data unit of the predetermined number of data units, augmenting the determined first error indicator by a first factor.

9. The method of claim 1, wherein determining the second error indicator for upper/slow pages includes:
  measuring the second error indicator on a predetermined number of data units, including:
    for each data unit of the predetermined number of data units:
      measuring the second error indicator at a second operating threshold; and
      measuring the second error indicator at the second operating threshold plus a predetermined increment.

10. The method of claim 9, further comprising, for each data unit of the predetermined number of data units, using the lower of the second error indicator at the second operating threshold and the second error indicator at the second operating threshold plus a predetermined increment as the determined second error indicator.

11. The method of claim 10, further comprising, for each data unit of the predetermined number of data units, augmenting the determined second error indicator by a second factor.

12. The method of claim 1, wherein the sequence of operations is performed for a first die in the storage medium to adjust the second target charge for the first die, further comprising performing the sequence of operations for a second die in the storage medium to adjust a distinct second target charge for the second die.

13. The method of claim 12, wherein a first adjustment for the second target charge for the first die, determined in accordance with the sequence of operations performed for the first die, is different than a second adjustment for the second target charge for the second die, determined in accordance with the sequence of operations performed for the second die.

14. The method of claim 13, wherein the second target charge for the first die is adjusted in a different direction than the second target charge for the second die.

15. The method of claim 1, further comprising:
  determining a first read threshold, a second read threshold, and a third read threshold, the first, second, and third read thresholds used for reading first, second, and third values, respectively, in cells of the storage medium when data is read from the cells;
  adjusting the second read threshold in accordance with the first error indicator and the second error indicator; and
  adjusting the third read threshold in accordance with the first error indicator and the second error indicator.

16. The method of claim 15, wherein the second read threshold and the third read threshold are adjusted at a faster rate than the second target charge.

17. The method of claim 1, wherein the first target charge, the second target charge, and the third target charge are determined, in part, in accordance with feed-forward characterization values.

18. A device operable to set target charges for a storage medium, the device comprising:
  a storage medium interface for coupling the device to the storage medium; and
  one or more modules, the one or more modules coupled to the storage medium interface and configured to:
    perform a sequence of operations, including:
      determining a first target charge, a second target charge, and a third target charge, the first, second, and third target charges used for controlling charge distributions in cells of the storage medium when data is written to the cells;
      determining a first error indicator for lower/fast pages of the storage medium;
      determining a second error indicator for upper/slow pages of the storage medium; and
      adjusting the second target charge in accordance with the first error indicator and the second error indicator.

19. The device of claim 18, wherein the one or more modules include a target charge module to determine the first target charge, second target charge, and third target charge; an error indicator module to determine the first error indicator and the second error indicator; and an adjustment module to adjust the second target charge.

20. The device of claim 19, wherein the one or more modules include a memory management module that includes one or more processors and memory storing one or more programs configured for execution by the one or more processors.

21. The device of claim 18, wherein adjusting the second target charge in accordance with the first error indicator and the second error indicator includes:
  accumulating a bias value for the second target charge, wherein the bias value increases in accordance with a determination that the first error indicator is greater than the second error indicator and the bias value decreases in accordance with a determination that the first error indicator is less than the second error indicator;
in accordance with a determination that the bias value is greater than or equal to a positive threshold:
increasing the second target charge; and
resetting the bias value; and
in accordance with a determination that the bias value is less than a negative threshold:
decreasing the second target charge; and
resetting the bias value.

22. The device of claim 18, wherein determining the first error indicator for lower/fast pages includes:
measuring the first error indicator on a predetermined number of data units, including, for each data unit of the predetermined number of data units:
measuring the first error indicator at a first operating threshold; and
measuring the first error indicator at the first operating threshold plus a predetermined increment.

23. The device of claim 18, wherein the sequence of operations is performed for a first die in the storage medium to adjust the second target charge for the first die, further comprising performing the sequence of operations for a second die in the storage medium to adjust a distinct second target charge for the second die.

24. A non-transitory computer-readable storage medium storing one or more programs configured for execution by a device coupled to a storage medium, the one or more programs comprising instructions for causing the device and/or storage medium to perform a sequence of operations, including:
determining a first target charge, a second target charge, and a third target charge, the first, second, and third target charges used for controlling charge distributions in cells of the storage medium when data is written to the cells;
determining a first error indicator for lower/fast pages of the storage medium;
determining a second error indicator for upper/slow pages of the storage medium; and
adjusting the second target charge in accordance with the first error indicator and the second error indicator.

25. The non-transitory computer-readable storage medium of claim 24, wherein adjusting the second target charge in accordance with the first error indicator and the second error indicator includes:
accumulating a bias value for the second target charge, wherein the bias value increases in accordance with a determination that the first error indicator is greater than the second error indicator and the bias value decreases in accordance with a determination that the first error indicator is less than the second error indicator;
in accordance with a determination that the bias value is greater than or equal to a positive threshold:
increasing the second target charge; and
resetting the bias value; and
in accordance with a determination that the bias value is less than a negative threshold:
decreasing the second target charge; and
resetting the bias value.

* * * * *